(12) United States Patent
Pohl et al.

(10) Patent No.: US 9,503,006 B2
(45) Date of Patent: Nov. 22, 2016

(54) PLASMA AND INDUCTION HEATING POWER SUPPLY SYSTEMS AND RELATED METHODS

(75) Inventors: Thomas Pohl, Ebringen (DE); Ulrich Heller, Niederrimsingen (DE); Holger Raschke, Umkirch (DE); Richard Gottschalk, Waldbronn (DE); Reinhard Schaefer, Freiamt (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 880 days.

(21) Appl. No.: 13/276,589

(22) Filed: Oct. 19, 2011

(65) Prior Publication Data
US 2012/0101642 A1    Apr. 26, 2012

(30) Foreign Application Priority Data
Oct. 20, 2010   (DE) .................. 10 2010 048 809

(51) Int. Cl.
| | | |
|---|---|---|
| G06F 1/26 | (2006.01) | |
| H02P 9/00 | (2006.01) | |
| G06F 9/44 | (2006.01) | |
| H01J 37/32 | (2006.01) | |
| H05H 1/46 | (2006.01) | |

(52) U.S. Cl.
CPC . *H02P 9/00* (2013.01); *G06F 8/38* (2013.01); *H01J 37/32908* (2013.01); *H05H 2001/4682* (2013.01)

(58) Field of Classification Search
CPC .................. H01J 37/32908; H05H 2001/4682; G05B 19/0426; G05B 2219/21029; G06F 8/34; G06F 8/38; H02P 3/00; H02P 9/00; H02J 3/46

USPC ............ 700/83, 86, 275, 276, 286, 295, 297
See application file for complete search history.

(56) References Cited

U.S. PATENT DOCUMENTS

| | | |
|---|---|---|
| 4,189,765 A | 2/1980 | Kotalik et al. |
| 4,283,723 A | 8/1981 | Bickley et al. |
| 4,570,217 A | 2/1986 | Allen et al. |
| 4,649,499 A | 3/1987 | Sutton et al. |
| 4,679,137 A | 7/1987 | Lane et al. |
| 4,755,811 A | 7/1988 | Slavin et al. |
| 4,763,356 A | 8/1988 | Day et al. |
| 4,766,425 A | 8/1988 | Tallman et al. |
| 4,805,089 A | 2/1989 | Lane et al. |

(Continued)

FOREIGN PATENT DOCUMENTS

| | | |
|---|---|---|
| CN | 1274219 A | 11/2000 |
| CN | 2521677 Y | 11/2002 |

(Continued)

*Primary Examiner* — Charles Kasenge
(74) *Attorney, Agent, or Firm* — Fish & Richardson P.C.

(57) ABSTRACT

In some aspects, a power supply system for a plasma application and/or an induction heating system includes at least two controllable power generators of different types. Each controllable power generator includes an associated identifier, and at least one operating unit for controlling at least one of the power generators, the operating unit includes an operating application to import the respective identifiers from the power generators that are connected to the operating application, and based on generator-specific configuration data that are stored for each power generator and the identifiers, the operating application constructs a graphic user interface on a display device of the operating unit.

29 Claims, 8 Drawing Sheets

(56) References Cited

U.S. PATENT DOCUMENTS

| | | | |
|---|---|---|---|
| 4,821,030 A | 4/1989 | Batson et al. | |
| 4,843,538 A | 6/1989 | Lane et al. | |
| 4,847,785 A | 7/1989 | Stephens | |
| 4,873,623 A | 10/1989 | Lane et al. | |
| 4,914,624 A | 4/1990 | Dunthorn | |
| 4,951,190 A | 8/1990 | Lane et al. | |
| 4,967,381 A | 10/1990 | Lane et al. | |
| 5,025,411 A | 6/1991 | Tallman et al. | |
| 5,081,332 A | 1/1992 | Sakuragawa | |
| 5,159,673 A | 10/1992 | Sackmann et al. | |
| 5,230,063 A | 7/1993 | Hoeber et al. | |
| 5,243,697 A | 9/1993 | Hoeber et al. | |
| 5,257,349 A | 10/1993 | Alexander | |
| 5,301,348 A | 4/1994 | Jaaskelainen | |
| 5,325,481 A | 6/1994 | Hunt | |
| 5,404,458 A | 4/1995 | Zetts | |
| 5,406,307 A | 4/1995 | Hirayama et al. | |
| 5,479,602 A | 12/1995 | Baecker et al. | |
| 5,495,566 A | 2/1996 | Kwatinetz | |
| 5,550,969 A | 8/1996 | Torres et al. | |
| 5,586,237 A | 12/1996 | Baecker et al. | |
| 5,596,738 A | 1/1997 | Pope | |
| 5,644,334 A | 7/1997 | Jones et al. | |
| 5,664,133 A | 9/1997 | Malamud et al. | |
| 5,727,174 A | 3/1998 | Aparicio et al. | |
| 5,745,718 A | 4/1998 | Cline et al. | |
| 5,805,442 A | 9/1998 | Crater et al. | |
| 5,874,807 A | 2/1999 | Neger et al. | |
| 5,874,948 A | 2/1999 | Shieh | |
| 5,892,440 A | 4/1999 | Bryan | |
| 5,909,192 A | 6/1999 | Finch et al. | |
| 5,975,737 A | 11/1999 | Crater et al. | |
| 5,978,742 A | 11/1999 | Pickerd | |
| 5,999,163 A | 12/1999 | Ivers et al. | |
| 6,002,398 A | 12/1999 | Wilson | |
| 6,061,603 A | 5/2000 | Papadopoulos et al. | |
| 6,139,177 A | 10/2000 | Venkatraman et al. | |
| 6,151,625 A | 11/2000 | Swales et al. | |
| 6,177,933 B1 | 1/2001 | Young | |
| 6,208,340 B1 | 3/2001 | Amin et al. | |
| 6,222,521 B1 | 4/2001 | Ivers et al. | |
| 6,229,536 B1 | 5/2001 | Alexander et al. | |
| 6,275,987 B1 | 8/2001 | Fraley et al. | |
| 6,282,454 B1 | 8/2001 | Papadopoulos et al. | |
| 6,298,377 B1 | 10/2001 | Hartikainen et al. | |
| 6,311,101 B1 | 10/2001 | Kastner | |
| 6,331,867 B1 | 12/2001 | Eberhard et al. | |
| 6,335,725 B1 | 1/2002 | Koh et al. | |
| 6,337,699 B1 | 1/2002 | Nielsen | |
| 6,359,634 B1 | 3/2002 | Cragun et al. | |
| 6,433,801 B1 | 8/2002 | Moon et al. | |
| 6,434,157 B1 | 8/2002 | Dube et al. | |
| 6,484,061 B2 | 11/2002 | Papadopoulos et al. | |
| 6,493,661 B1 | 12/2002 | White et al. | |
| 6,496,209 B2 | 12/2002 | Horii | |
| 6,502,234 B1 | 12/2002 | Gauthier et al. | |
| 6,512,966 B2* | 1/2003 | Lof et al. | 700/291 |
| 6,559,868 B2 | 5/2003 | Alexander et al. | |
| 6,564,375 B1 | 5/2003 | Jiang | |
| 6,574,791 B1 | 6/2003 | Gauthier et al. | |
| 6,580,442 B1 | 6/2003 | Singh et al. | |
| 6,584,559 B1 | 6/2003 | Huh et al. | |
| 6,587,884 B1 | 7/2003 | Papadopoulos et al. | |
| 6,618,692 B2 | 9/2003 | Takahashi et al. | |
| 6,628,311 B1 | 9/2003 | Fang | |
| 6,653,821 B2* | 11/2003 | Kern et al. | 290/40 B |
| 6,691,064 B2 | 2/2004 | Vroman | |
| 6,728,262 B1 | 4/2004 | Woram | |
| 6,732,191 B1 | 5/2004 | Baker et al. | |
| 6,760,782 B1 | 7/2004 | Swales | |
| 6,766,210 B2 | 7/2004 | Jun et al. | |
| 6,772,033 B2 | 8/2004 | Scherer et al. | |
| 6,775,576 B2* | 8/2004 | Spriggs et al. | 700/8 |
| 6,778,921 B2 | 8/2004 | Keane et al. | |
| 6,785,730 B1 | 8/2004 | Taylor | |
| 6,791,545 B2 | 9/2004 | Miller et al. | |
| 6,795,798 B2 | 9/2004 | Eryurek et al. | |
| 6,801,920 B1 | 10/2004 | Wischinski | |
| 6,819,315 B2 | 11/2004 | Toepke et al. | |
| 6,819,960 B1 | 11/2004 | McKelvey et al. | |
| 6,832,118 B1 | 12/2004 | Heberlein et al. | |
| 6,854,055 B1 | 2/2005 | Stinus et al. | |
| 6,857,105 B1 | 2/2005 | Fox et al. | |
| 6,865,717 B2 | 3/2005 | Wright | |
| 6,889,096 B2* | 5/2005 | Spriggs et al. | 700/17 |
| 6,891,849 B1 | 5/2005 | Jasperneite et al. | |
| 6,901,306 B2 | 5/2005 | Nakamoto et al. | |
| 6,927,770 B2 | 8/2005 | Ording | |
| 6,952,727 B1 | 10/2005 | Lindner et al. | |
| 6,962,644 B2 | 11/2005 | Paterson et al. | |
| 6,963,922 B2 | 11/2005 | Papadopoulos et al. | |
| 6,993,404 B2 | 1/2006 | Lev et al. | |
| 6,995,545 B2 | 2/2006 | Tracy et al. | |
| 7,024,548 B1 | 4/2006 | O Toole | |
| 7,035,768 B2 | 4/2006 | Matsuda | |
| 7,035,898 B1 | 4/2006 | Baker | |
| 7,058,693 B1 | 6/2006 | Baker | |
| 7,061,926 B2 | 6/2006 | Breinlinger | |
| 7,082,576 B2 | 7/2006 | Shahine et al. | |
| 7,085,841 B2 | 8/2006 | Edwards et al. | |
| 7,089,414 B2 | 8/2006 | Langford et al. | |
| 7,113,904 B2 | 9/2006 | Litster et al. | |
| 7,119,797 B2 | 10/2006 | Kawano et al. | |
| 7,120,917 B2 | 10/2006 | Feist | |
| 7,124,239 B2 | 10/2006 | Saito et al. | |
| 7,131,000 B2 | 10/2006 | Bradee | |
| 7,133,921 B2 | 11/2006 | Nasman et al. | |
| 7,137,074 B1 | 11/2006 | Newton et al. | |
| 7,146,408 B1 | 12/2006 | Crater et al. | |
| 7,146,541 B2 | 12/2006 | Blumberg et al. | |
| 7,178,103 B2 | 2/2007 | Humphrey et al. | |
| 7,197,634 B2 | 3/2007 | Kruger et al. | |
| 7,203,560 B1 | 4/2007 | Wylie et al. | |
| 7,219,306 B2 | 5/2007 | Kodosky et al. | |
| 7,233,830 B1 | 6/2007 | Callaghan et al. | |
| 7,245,293 B2 | 7/2007 | Hoshino et al. | |
| 7,262,555 B2 | 8/2007 | Rueger et al. | |
| 7,263,546 B1 | 8/2007 | Kostadinov | |
| 7,266,589 B2 | 9/2007 | Brownhill et al. | |
| 7,281,221 B2 | 10/2007 | Zver et al. | |
| 7,285,916 B2 | 10/2007 | Wi | |
| 7,290,030 B2 | 10/2007 | Edwards | |
| 7,308,678 B2 | 12/2007 | Allor | |
| 7,312,827 B2 | 12/2007 | Cazier | |
| 7,345,679 B2 | 3/2008 | Katayose | |
| 7,350,207 B2 | 3/2008 | Fisher | |
| 7,356,774 B2 | 4/2008 | Shah et al. | |
| 7,411,582 B2 | 8/2008 | Toepke et al. | |
| 7,418,669 B2 | 8/2008 | Melzer | |
| 7,421,531 B2 | 9/2008 | Rotvold et al. | |
| 7,443,396 B2 | 10/2008 | Ilic | |
| 7,467,018 B1 | 12/2008 | Callaghan | |
| 7,475,358 B2 | 1/2009 | Anzelde et al. | |
| 7,490,138 B2 | 2/2009 | Crater et al. | |
| 7,493,337 B2 | 2/2009 | Chaudhuri et al. | |
| 7,502,868 B2 | 3/2009 | Genin et al. | |
| 7,536,538 B1 | 5/2009 | Huang et al. | |
| 7,612,661 B1 | 11/2009 | Johnson et al. | |
| 7,644,295 B1* | 1/2010 | Dotson et al. | 713/340 |
| 7,672,737 B2 | 3/2010 | Hood et al. | |
| 7,681,055 B2 | 3/2010 | Iijima | |
| 7,813,814 B2* | 10/2010 | Dittes | 700/2 |
| 7,908,348 B2* | 3/2011 | Kumar et al. | 709/220 |
| 8,346,401 B2* | 1/2013 | Pollack et al. | 700/291 |
| 8,463,561 B2* | 6/2013 | Gamboa Tuesta et al. | 702/61 |
| 8,803,362 B2* | 8/2014 | Schmiegel | 307/85 |
| 8,868,378 B2* | 10/2014 | Batzler | G05B 23/0216 702/188 |
| 2002/0112038 A1 | 8/2002 | Hessmer et al. | |
| 2003/0105544 A1* | 6/2003 | Kauffman et al. | 700/109 |
| 2004/0039468 A1 | 2/2004 | Zahorack et al. | |
| 2004/0111512 A1 | 6/2004 | Barth | |
| 2004/0176868 A1 | 9/2004 | Haga et al. | |
| 2004/0205111 A1 | 10/2004 | Chasmawala et al. | |

(56) References Cited

U.S. PATENT DOCUMENTS

| | | |
|---|---|---|
| 2005/0137845 A1 | 6/2005 | Carroll et al. |
| 2005/0229037 A1* | 10/2005 | Egan et al. ................. 714/14 |
| 2005/0231348 A1 | 10/2005 | Roth et al. |
| 2006/0130047 A1 | 6/2006 | Burugapalli |
| 2006/0136829 A1 | 6/2006 | Abbar et al. |
| 2006/0184356 A1 | 8/2006 | Kim et al. |
| 2006/0242621 A1 | 10/2006 | Ye et al. |
| 2007/0018955 A1 | 1/2007 | Blersch |
| 2007/0150819 A1 | 6/2007 | Goodman et al. |
| 2007/0288125 A1 | 12/2007 | Quaratiello |
| 2008/0105538 A1 | 5/2008 | Winterhalter et al. |
| 2008/0158170 A1 | 7/2008 | Herz et al. |
| 2008/0168393 A1 | 7/2008 | Rosskopt |
| 2008/0183303 A1 | 7/2008 | West |
| 2008/0281850 A1 | 11/2008 | Schoning |
| 2009/0037013 A1 | 2/2009 | Hendler et al. |
| 2009/0043520 A1* | 2/2009 | Pollack et al. .............. 702/62 |
| 2009/0064143 A1 | 3/2009 | Bhogal et al. |
| 2009/0089709 A1 | 4/2009 | Baier et al. |
| 2009/0094682 A1 | 4/2009 | Sage et al. |
| 2009/0119618 A1 | 5/2009 | Norman et al. |
| 2009/0119669 A1 | 5/2009 | Norman et al. |
| 2009/0240377 A1* | 9/2009 | Batzler ............ G05B 23/0216 700/287 |
| 2011/0015799 A1* | 1/2011 | Pollack et al. ............. 700/291 |
| 2011/0016063 A1* | 1/2011 | Pollack et al. ............. 705/412 |
| 2011/0130982 A1* | 6/2011 | Haag et al. ................. 702/62 |
| 2011/0213506 A1* | 9/2011 | Gamboa Tuesta et al. .. 700/287 |

FOREIGN PATENT DOCUMENTS

| | | |
|---|---|---|
| CN | 1632774 A | 6/2005 |
| CN | 1987490 A | 6/2007 |
| DE | 10148029 A1 | 4/2003 |
| DE | 10326493 A1 | 1/2005 |
| DE | 102006052061 B4 | 4/2009 |
| EP | 0335139 A2 | 10/1989 |
| EP | 0507470 A2 | 10/1992 |
| EP | 1100231 A1 | 5/2001 |
| EP | 1408395 A2 | 4/2004 |
| EP | 1430379 A2 | 6/2004 |
| EP | 1200884 B1 | 8/2005 |
| EP | 1188293 B1 | 10/2005 |
| EP | 1589793 A1 | 10/2005 |
| EP | 0937289 B1 | 3/2006 |
| EP | 1801946 A1 | 6/2007 |
| EP | 1895374 A2 | 3/2008 |
| EP | 1906288 A2 | 4/2008 |
| EP | 2076784 A2 | 7/2009 |
| GB | 2430774 A | 4/2007 |
| JP | 9062446 A | 3/1997 |
| JP | 2000092094 A | 3/2000 |
| JP | 2008243136 A | 10/2008 |
| JP | 2009187976 A | 8/2009 |
| KR | 900006180 B1 | 8/1990 |
| KR | 1020050100253 A | 10/2005 |
| TW | 544624 B | 8/2003 |
| WO | 0057281 A1 | 9/2000 |
| WO | 03065192 A1 | 8/2003 |
| WO | 2004084165 A2 | 9/2004 |
| WO | 2006111573 A1 | 10/2006 |
| WO | 2007045133 A1 | 4/2007 |
| WO | 2008046695 A1 | 4/2008 |
| WO | 2008061784 A1 | 5/2008 |
| WO | 2008064763 A1 | 6/2008 |
| WO | 2008090420 A1 | 7/2008 |
| WO | 2009006149 A1 | 1/2009 |

* cited by examiner

```xml
<?xml version="1.0" encoding="utf-8" ?>
- <VisualizationDefinition xmlns:xsi=
    "http://www. XMLSchema-instance"
    xsi:noNamespaceSchemaLocation=
    "VisualizationDefinition.xsd"
    author="pldversion="1.2">
- <Generator id="4" description=
    "TruPlasma 3012">
- <SoftwareVersion version="00.12.13"
    integrationLevel="07" description=
    "If no software is available, the integration
    level is zero. This means that a sw update is necessary!">
    - <!-- ++++++++++++++++++++++++++++++++ -->
    - <!-- Status indicator                 -->
    - <!-- ++++++++++++++++++++++++++++++++ -->
- <StatusIndicator description="Status indicator field">
- <Parameter id="5000" sub-id="1" description="Parameter that contains
    all status information" datatype="uint8" writable="false">
- <Bitfield>
- <Slot id="0">
   <TextSlot position="0" text_id="RFPLASMA_STATIND_FAULT" />
   <Bit position="1" description="Alarm" color="red" />
   </Slot>
- <Slot id="1">
   <TextSlot position="1" text_id="RFPLASMA_STATIND_WARNING" />
   <Bit position="2" description="Warning" color="yellow" />
   </Slot>
- <Slot id="2">
   <TextSlot position="2" text_id="RFPLASMA_STATIND_RFON" />
   <Bit position="3" description="Power" color="white" />
   </Slot>
- <Slot id="3">
   <TextSlot position="3" text_id="RFPLASMA_STATIND_RDY1" />
   <Bit position="4" description="Rdy1" color="white" />
   </Slot>
- <Slot id="4">
   <TextSlot position="4" text_id="RFPLASMA_STATIND_RDY2" />
   <Bit position="5" description="Rdy2" color="white" />
   </Slot>
- <Slot id="5">
   <TextSlot position="5" text_id="RFPLASMA_STATIND_RFAPPL_ACTIVE"
    />
   <Bit position="6" description="RF Application is active" color="white" />
   </Slot>
        . . .
```

FIG. 9

PLASMA AND INDUCTION HEATING POWER SUPPLY SYSTEMS AND RELATED METHODS

CROSS REFERENCE TO RELATED APPLICATION

This application claims priority under 35 U.S.C. §119(a) to German Application No. 10 2010 048 809.7, filed on Oct. 20, 2010, the entire contents of which are hereby incorporated by reference.

TECHNICAL FIELD

The invention relates to plasma and induction heating power supply systems and to related methods.

BACKGROUND

Manufacturers of power generators for plasma applications and induction heating applications have in the past developed various types of power supply systems. For a large number of these power supply systems, various control systems have been developed that differ in terms of size, construction, user interface and functionality. This can be costly and complex for the user and the development of various control systems is linked with considerable development costs.

SUMMARY

In some aspects of the invention, a power supply system for a plasma application and/or an induction heating application includes at least two controllable power generators of different types, with which an identifier is associated respectively, and an operating unit for controlling at least one of the power generators. The operating unit has a display device on which a graphic user interface can be displayed, an input device for manipulating the graphic user interface, and an operating application which imports the identifier from power generators which are connected thereto. Based on generator-specific configuration data which are stored for the power generator and the identifier, the operating application constructs an appropriate graphic user interface on the display device.

It is possible to operate different controllable power generators with only one operating unit. If the operating application, due to the identifier associated with the power generator, identifies which generator is intended to be operated, it is possible based on the identifier to use the correct configuration data for that specific generator in order to construct the graphic user interface. The graphic user interface is substantially the same for all the power generators. There are only slight adaptations to the generator. For example, the maximum adjustable power can be 1 kW in the case of a 1 kW generator. With another type of generator, such as, a 3 kW generator, a maximum power of 3 kW may be adjusted accordingly. Power generators of various types can be generators that operate in various frequency ranges that have different nominal output power levels, that are used in a plasma application and/or in an induction heating application, and that are alternating current generators or direct current generators. This listing of various types of power generator is not intended to be a conclusive listing.

The configuration data of a power generator can be stored in the power generator itself or in the operating unit of the power supply system. The configuration data can be stored in the generator and be read by an operating unit after it has been connected. This has the advantage that the newest power generators, which are not yet known to a relatively old operating unit can also be controlled. Alternatively, the configuration data can be stored directly in the operating unit. This has the advantage that power generators that do not yet have the possibility of storing configuration data themselves can also be controlled by the operating unit. The configuration data can be stored in a plurality of configuration files. However, it is also possible to store all the configuration data of all power generators in a single configuration file. The data that belong to a power generator type can be stored in the configuration file. Due to the identifier, the operating unit or the operating application indicates which data from the configuration file should be accessed in order to be able to operate a selected power generator.

The configuration data can include generator-specific parameter data and/or visualization data. The parameter data can describe all known parameters for the corresponding power generator or a sub-quantity thereof. Visualization data can describe parameters to be visualized and the manner in which they are intended to be displayed on the graphic user interface. Only a sub-quantity of visualization data can also be described if there are static parameters that are consistent for each power generator and are also intended to be displayed in a consistent manner, such as, for example, current, voltage and power. The data or data files may be present in Extensible Markup Language (XML) or another description format. XML is a language for representing data that are structured in a hierarchical manner in the form of text data.

Language data that can be processed by the operating application can be stored in the operating unit. The language data can be stored for various languages in various files. For example, there can be a file for each language. However, several languages can also be grouped in a file and combined together.

In order to be able to operate many different power generators with one operating unit, it is advantageous for the graphic user interface to be dynamically constructed. It is thereby also possible to operate newer power generators with a relatively old operating unit because the necessary information (i.e., the configuration data) can be stored on the respective power generator and the graphic user interface can be generated using these data.

Templates generated in the operating application can be stored in the operating unit. These templates can be defined in order to allow a more specific graphic user interface for visualizing data or parameters. Parameters can then be associated with the masks in the visualization file.

It is also advantageous if there are multiple operating units that substantially have the same graphic user interface. The intuitive operability of the power generators is thereby facilitated. Operating units can include, for example, personal computers, notebook computers, a panel that is separate from the power generator, or an integrated panel. This listing is not intended to be definitive. Other embodiments, such as, for example, a touchpad or a Man-Machine Interface (MMI) can also be provided.

In addition to the power generators, system components that can be controlled by the operating unit and that each have an identifier can be provided. Consequently, it is also possible to operate additional system components with the same operating unit as the power generators. As system components, it is possible to use, for example, impedance matching units, a plasma chamber, and/or other machine components.

In another aspect of the invention, a method for controlling at least one power generator using an operating unit includes importing an identifier of at least one power generator, selecting and/or importing generator-specific configuration data in accordance with the identifiers imported, and constructing a graphic user interface on a display device of the operating unit in accordance with the configuration data by using an operating application which is installed on the operating unit.

It is first possible to import an identifier of a power generator. Using the identifier, it is then possible to import generator-specific configuration data. Alternatively, it is possible to first load configuration data (e.g., for a plurality of different generator types), subsequently to import an identifier and then to select the relevant configuration data for the power generator to be operated using the identifier. After the operating unit has been connected to the generator, the operating application can then construct a graphic user interface using configuration data (e.g., parameters and/or visualization data). Subsequently, language data can be used in order to provide the language information.

For configuration data of different power generators, it is possible to produce substantially the same graphic user interfaces. Graphic user interfaces that are substantially the same are intended to be understood to be those user interfaces which have the same appearance, so that substantially all power generator types can be operated with one graphic user interface which has the same appearance. However, the details may vary.

The user interface that is substantially the same can have a static region. The static region can be arranged at one or more peripheral regions of the user interface on a display device (e.g., a screen). It can be arranged for substantially all power generator types and system component types at the same location of the user interface and always have substantially the same dimensions with respect to the display device (i.e., the static region can always take up the same percentage surface-area of the user interface). The static region may illustrate superordinate information and control elements, which are present at the same time for all power generators or system components. Superordinate control elements can include an on/off switch, operating status selection (e.g., control/adjustment mode, diagnosis mode, software update), and/or language selection. Superordinate information can include type designation, identifier of the power generator, warnings, error statuses, operating status display, cooling water temperature, and/or connection status.

The user interface that is substantially the same can have a dynamic region. The dynamic region can be arranged at one or more peripheral regions of the operating interface on a display device, such as a video screen. It can be arranged at the same location for substantially all power generator types and system component types and have the same dimensions with respect to the display device (i.e., the dynamic region can occupy the same percentage surface-area of the user interface). In the portion of the graphic user interface associated with the dynamic region, the information relating to only one power generator can be displayed and the information relating to other power generators can be hidden. It is possible to provide tabs by which it is possible to select the power generator for which information is intended to be displayed. The dynamic region can have a predetermined grid in which values can be displayed and adjusted. Depending on the identifier of the power generator, the dynamic region can have a different number of displayed values and values to be adjusted. Views in the form of tabs can also be provided in the dynamic region for displaying various topics, such as, for example, initial variables, arc detection, or other properties of a power generator.

Comparable values (e.g., electric current, voltage, frequency, power, and other values) can be displayed at the same location in the case of different power generator types or provided for adjustment.

Control elements for changing between different views or information contents in the dynamic region may be provided in the static region of the user interfaces. The different views or information contents can include information relating to diagnosis, monitoring, control, configuration, and/or software updates. The selectable views or information contents provided can be the same for all power generator types.

The number of regions on the graphic user interface can be limited to a maximum of two (e.g., a static and a dynamic region) that are both always visible for the user. This improves the clarity and consequently the user-friendliness.

The slight deviations can be related to the generator type, but they can also be dependent on the type of operating unit. For example, slight differences may be necessary if a touchscreen is used as an operating unit as an input device for the operating unit instead of a mouse or keyboard.

Regardless of the number and type of connected power generators and system components, the same proportion of the surface-area of the user interface can be associated with the dynamic region and the same proportion on the surface-area of the user interface can be associated with the static region. Furthermore, the same shape and arrangement on the graphic user interface or the display device can be provided for the regions mentioned.

The configuration data can include generator-specific parameter data and/or visualization data. The parameter data include all or at least some of the parameters known for the power generator. The visualization data determine the structure of the graphic user interface. The parameters to be displayed are associated with various display elements, from which the operating application in the operating unit composes the graphic user interface. The operating unit can display static and dynamic contents. It is thus possible, for example, for a message region to be static because it is provided for each power generator. Conversely, operating information can be dynamic because it is produced in a generator-specific manner from the visualization data and the parameter data.

In some embodiments, language data can be read and information can be displayed on the display device in accordance with the language data. It is consequently possible to carry out adaptation to the specific user and the user's language skills.

As already mentioned above, it is typically advantageous for the graphic user interface to be constructed in a dynamic manner.

Templates that enable the graphic user interface to be adapted can be defined in the operating application. Visualization data can be associated with the templates.

For identical configuration data, it is possible to produce and display substantially identical graphic user interfaces in different operating units. Consequently, due to different operating units, such as operating units including a display, a mouse and a keyboard or operating units including a display with a touchpad, power generators can have substantially the same graphic user interface so that a user can operate the power generator, with little regard to the operating unit used, once the user has become familiar with only one operating unit.

Furthermore, the identifier and the configuration data of a controllable system component can be imported and taken into consideration when constructing the graphic user interface. The operating units can therefore also be used to operate and control other components of the power supply system such as, for example, an impedance matching unit. For these system components, no separate operating units are typically necessary. A single operating unit can be used in order to operate a plurality of generators and/or other system components at the same time.

The configuration data of a power generator can be stored in the power generator or in the operating unit and can have a time stamp or a priority identification number. The operating application can decide based on the time stamp or the priority identification number whether the configuration data stored in the power generator or the operating unit are used to construct the graphic user interface on the display device. In this manner, the most current configuration data can typically be used when constructing the graphic user interface.

With each power generator and also each controllable system component, there can be associated a software status and/or an integration level, which is interrogated by the operating application. The software status or integration level is taken into account when constructing the graphic user interface. A power generator type can differ by different software statuses. In addition to differing software statuses, statuses in the programmable logic (related to a complex programmable logic device (CPLD) and/or a field-programmable gate array (FPGA)) can also change. Furthermore, parameters stored in the device can change. These changes in the device can lead to different integration levels of the device type. For this reason, each generator typically has an integration level that describes the system status. This can be continuous numbering, which begins at one and increases with any software change of any component in the system. Numbering can start at one because zero can indicate an undefined status. The operating application, in addition to the identifier of the power generator, can also determine the integration level and construct the graphic user interface on the display device in accordance with the respective integration level. It is possible to proceed in a flexible manner in this instance. If the identifier of the operating application is known, but the integration level is not yet known, it is also possible to use an older integration level for constructing the graphic user interface.

In some aspects of the invention, a plasma system and/or an induction heating system includes a first group of different power generators and a second group of different operating units. An identifier is associated with each power generator type. Each operating unit of the second group is able to be coupled to each power generator of the first group in order to control the respective power generator, and is able to import the identifier of the coupled power generator. Each operating unit has an operating application by which there can be produced, regardless of the power generator coupled to the operating unit, a graphic user interface which has the same general appearance for all power generators but which is adapted to the coupled power generator(s).

Using the systems and methods described herein, it is possible to operate a product range of a manufacturer with different operating units, and the graphic user interface or the appearance of the graphic user interface is substantially identical for all operating units and all types of power generator.

The details of one or more embodiments of the invention are set forth in the accompanying drawings and the description below. Other aspects, features, and advantages of the invention will be apparent from the description and drawings, and from the claims.

DETAILED DESCRIPTION

Figure 1:
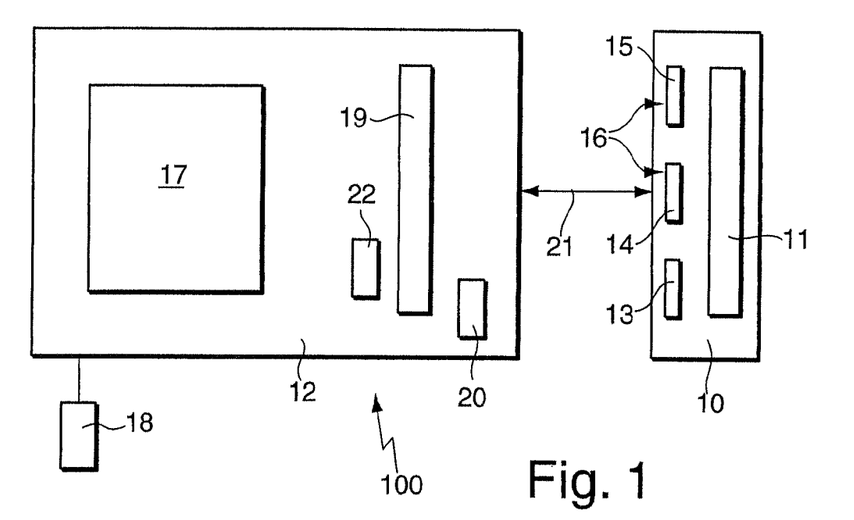
FIG. 1 is a schematic illustration of a power supply system.

A power supply system 100 shown in FIG. 1 includes a power generator 10. A power generator application 11 that can be influenced by an operating unit 12 runs in the power generator 10. An identifier 13 is stored in the power generator 10. Parameter data 14 and visualization data 15 are also stored in the power generator 10. The parameter data 14 and visualization data 15 together constitute configuration data 16. The visualization data 15 and parameter data 14 can also be combined in one file.

The operating unit 12 includes a display device 17 and an input device 18, (e.g., a touchpad, a mouse, or a keyboard). The operating unit 12 imports the identifier 13 of the power generator 10. The operating unit 12 further imports the configuration data 16. Using the identifier 13 and the configuration data 16, a graphic user interface is constructed on the display device 17 by an operating application 19 using language data 20 which are stored in the operating unit 12. A user can input or change values using the input device 18 and the graphic user interface. Based on these inputs, the operating unit 12 can control the power generator 10. The operating unit 12 is connected to the power generator 10 by a data connection 21 that is indicated by the double-headed arrow. Templates 22 can be produced on the operating unit 12, which allows a specific user-defined interface for visualizing generator-specific data. The operating unit 12 can also be connected to another type of power generator 10 or another controllable system component of the power generator system 100 in terms of data-processing and be used to control it.

Figure 2:
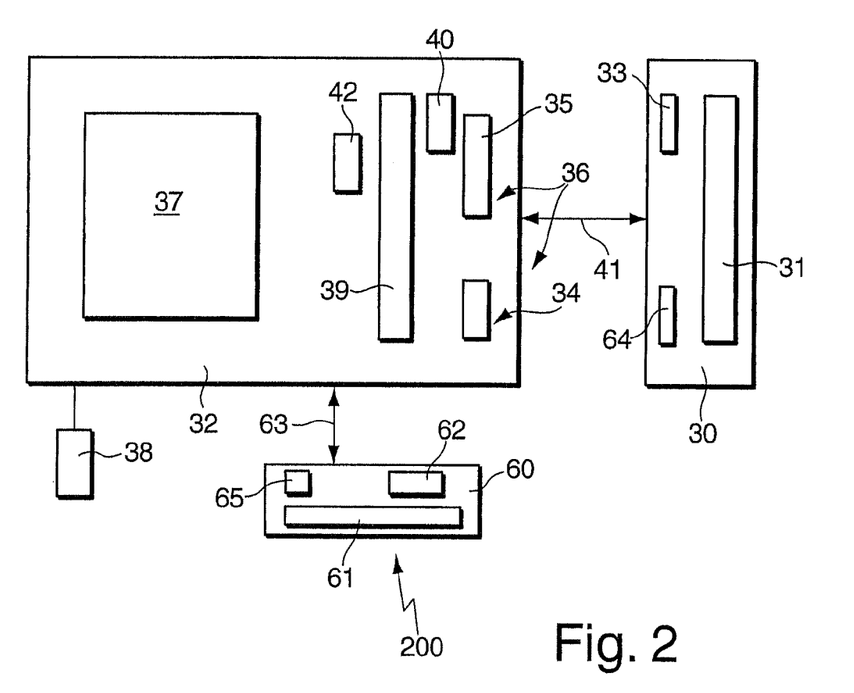
FIG. 2 is a schematic illustration of a power supply system.

FIG. 2 illustrates another example of a power generator system 200. The power generator system 100 includes a power generator 30 that has only one power generator application 31 and one identifier 33. Parameter data 34 and visualization data 35, which are collectively the configuration data 36, are stored in an operating unit 32. The configuration data 36 can also include data of other power generators or controllable system components.

Using the identifier 33 that is imported by the operating unit 32, the appropriate configuration data for the power generator 30 can be selected. Using the configuration data 36 and language data 40, it is possible for an operating application 39 to construct a graphic user interface which is displayed on the display device 37. The graphic user interface 37 can be influenced by a user using the input device 38 (e.g., a touchpad, a mouse or a keyboard). It is also possible to generate templates 42 in this instance.

The power generator 30 can be controlled via the operating unit 32 by a data connection 41.

Still referring to FIG. 2, the power supply system 200 includes a controllable system component 60 (e.g., an impedance matching unit). The system component 60 has a system component application 61 and an identifier 62. The identifier 62 can be imported from the operating unit 32 via the data connection 63. Configuration data 36 that belong to the system component 60 can be determined using the identifier 62. The graphic user interface displayed on the display device 37 can be modified in such a manner that the data relating to the system component 60 can also be manipulated. Consequently, the system component 60 can also be controlled by the operating unit 32. In addition to the identifier 32, the power generator 30 can also have an integration level 64 which can be imported from the operating unit 32. The system component 60 can also have an integration level 65 in addition to the identifier 62. It is thereby possible to select the configuration data 36 that best reflect the system status of the power generator 30 or the system component 60. The data connections 21 and 41 are an integral component of a network.

Figure 3:
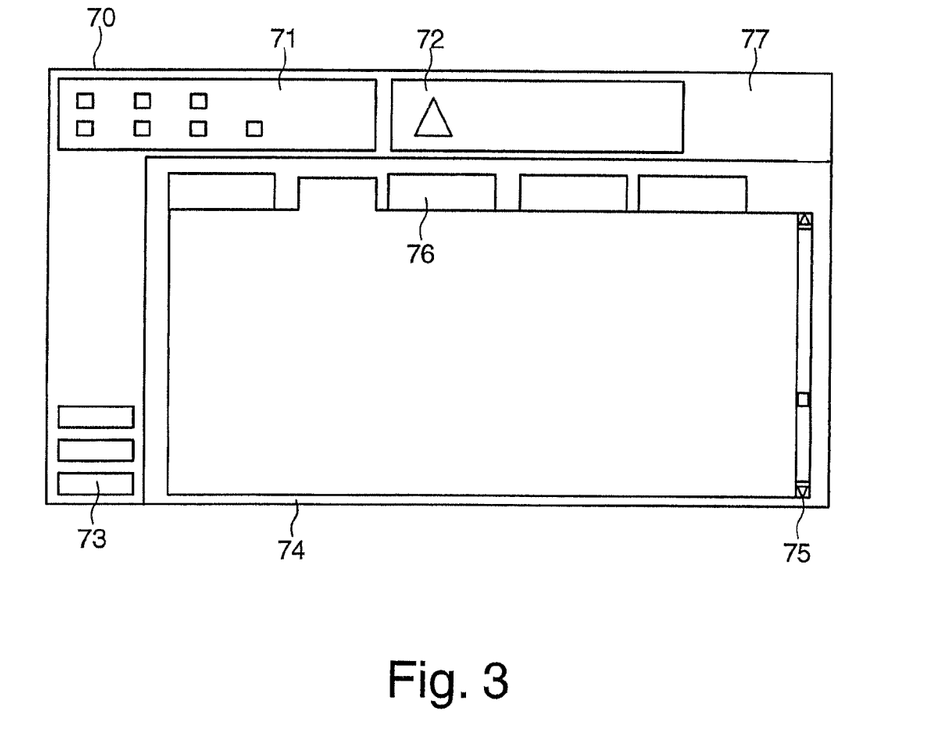
FIG. 3 is an illustration of a graphic user interface.

The graphic user interface 70 shown in FIG. 3 has a static region 77 and a dynamic region 74. The dynamic region 74 has a plurality of tabs 76, by which the user can select the desired display. The dynamic region 74 can include a scrolling bar 75. The static region 77 has primary information and control elements 73. Superordinate information to be displayed can be, for example, a status message region 71 and a warning and/or error message region 72.

Figure 4:
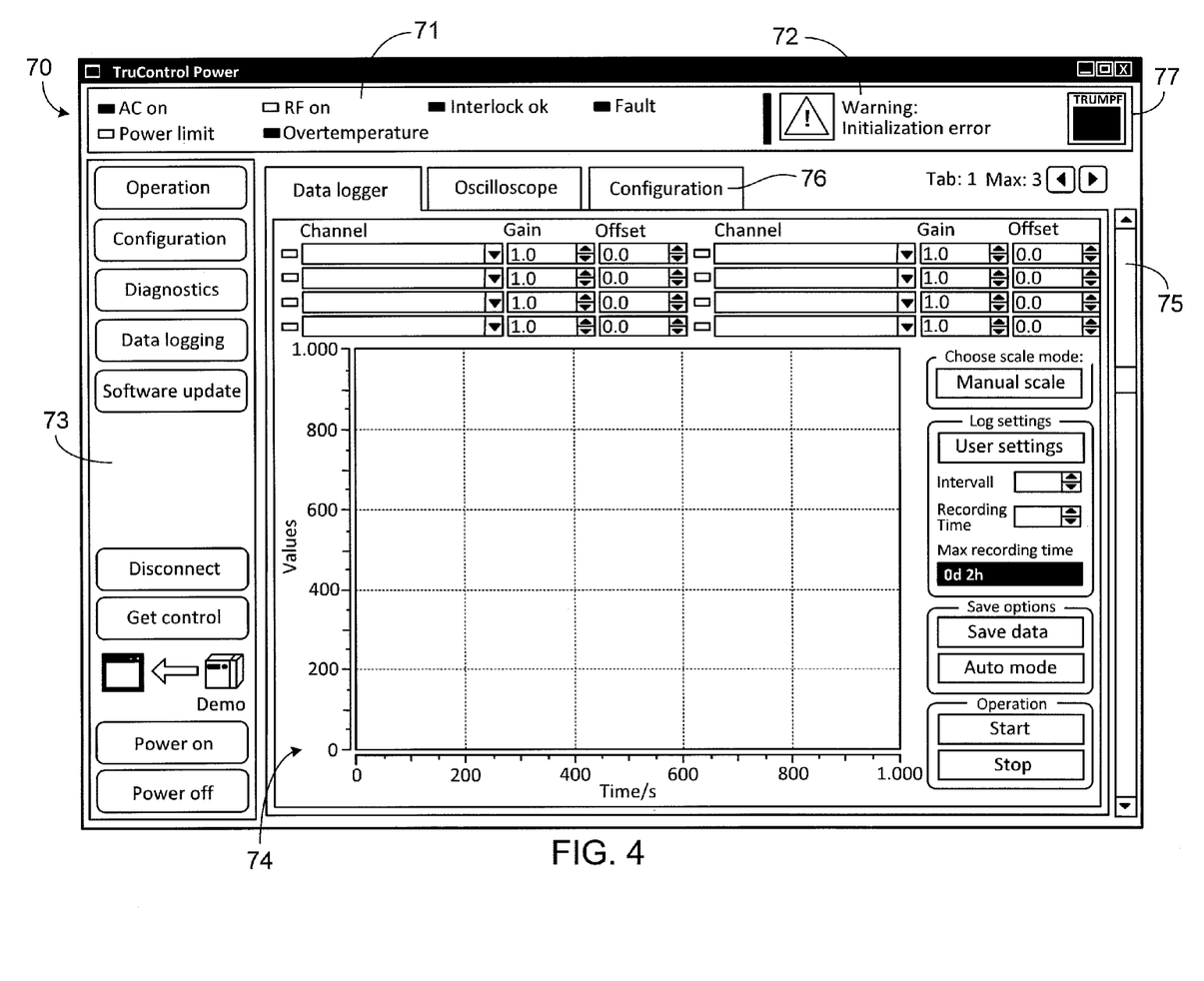
FIGS. 4 and 5 show screen shots taken from the graphic user interface of FIG. 3.
Figure 5:
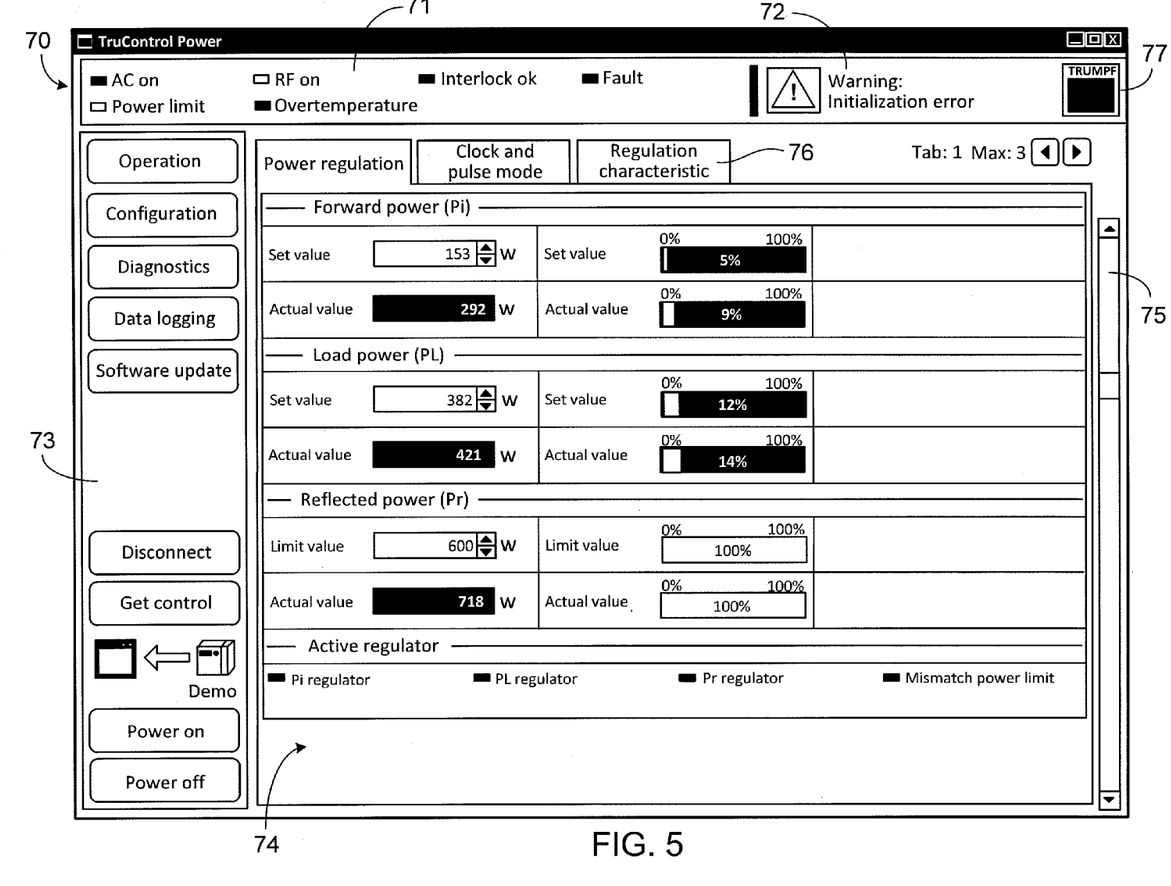

FIGS. 4 and 5 are screen shots of different examples of the graphic user interface 70. Control elements 73 are provided to control the different power generators 30 and controllable system component 60 using the graphic user interface 70. By selecting different control elements 73 (e.g., Operation, Configuration, Diagnostics, Data logging, and other elements), the dynamic region 74 can include different type of information that can be selected using multiple tabs 76. When the Data logging control element 73 is selected, as shown in FIG. 4, one set of tabs 76 (e.g., Data logger, Oscilloscope, and Configuration) can be displayed in the dynamic region 74. Similarly, when the Operation control element 73 is selected, as shown in FIG. 5, a different set of tabs 76 (e.g., Power regulation, Clock and pulse mode, and Regulation characteristic) can be displayed in the dynamic region 74.

Figure 6:
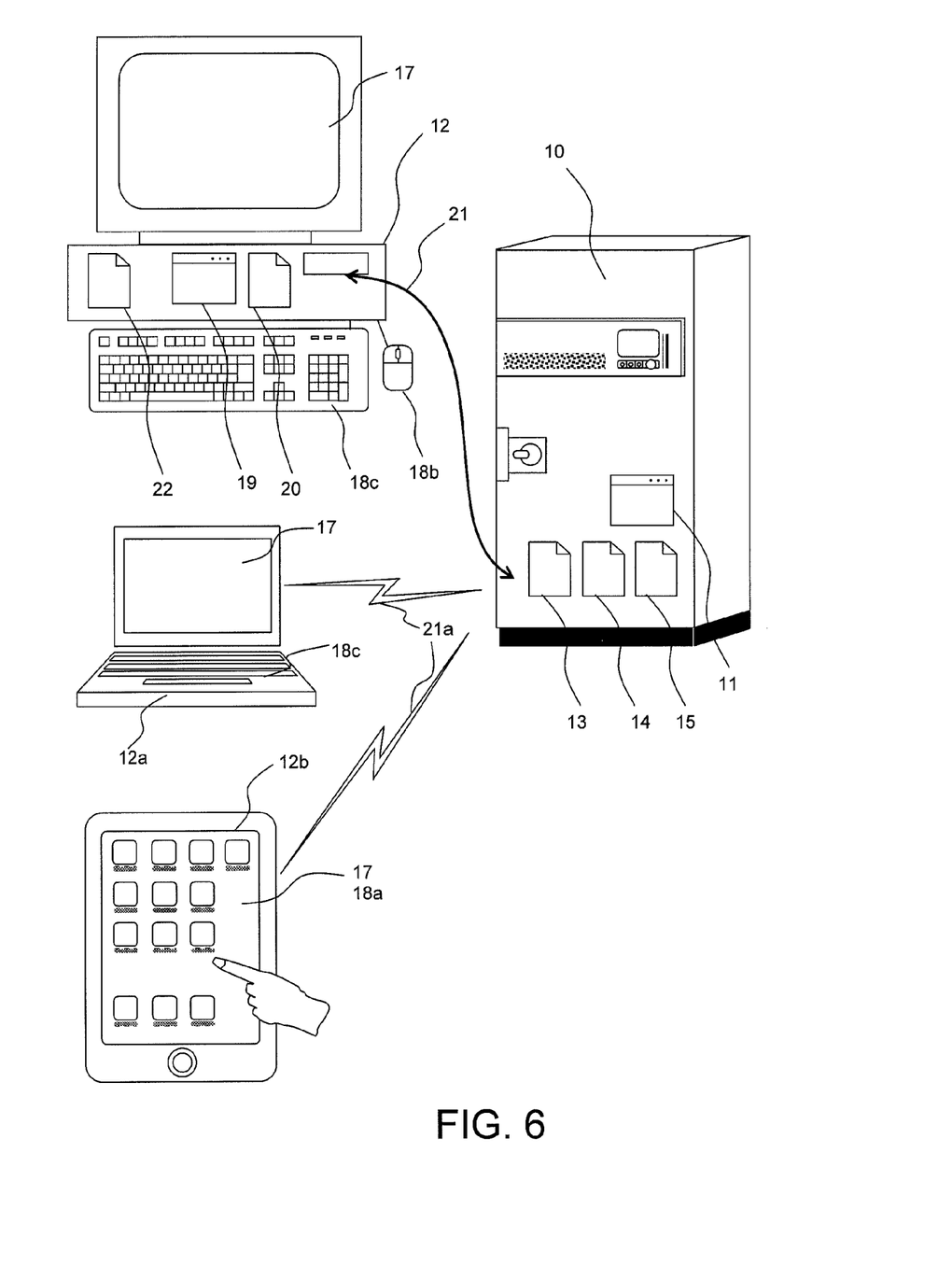
FIG. 6 is a schematic illustration of the power supply system of FIG. 1.

FIG. 6 shows an example layout of the power supply system 100 of FIG. 1. As shown, the power supply system includes several different operating units, for example, a personal computer 12, a laptop 12a, or a touchpad operating unit 12b (e.g., a smart phone, a tablet personal computer, or similar device). The operating units 12-12b can be used individually or together in a network. The operating units 12-12b can be connected to a power generator 10 by a wired data connection 21 or by a wireless data connection 21a.

Input devices 18 of the respective operating units 12-12b can be a touchpad 18a in connection with the display device 17, a mouse 18b, a keyboard 18c, or a similar device. During setup and operation of the power supply system 100, the operating unit 12 imports an identifier 13 of the power generator 10.

Figure 7:
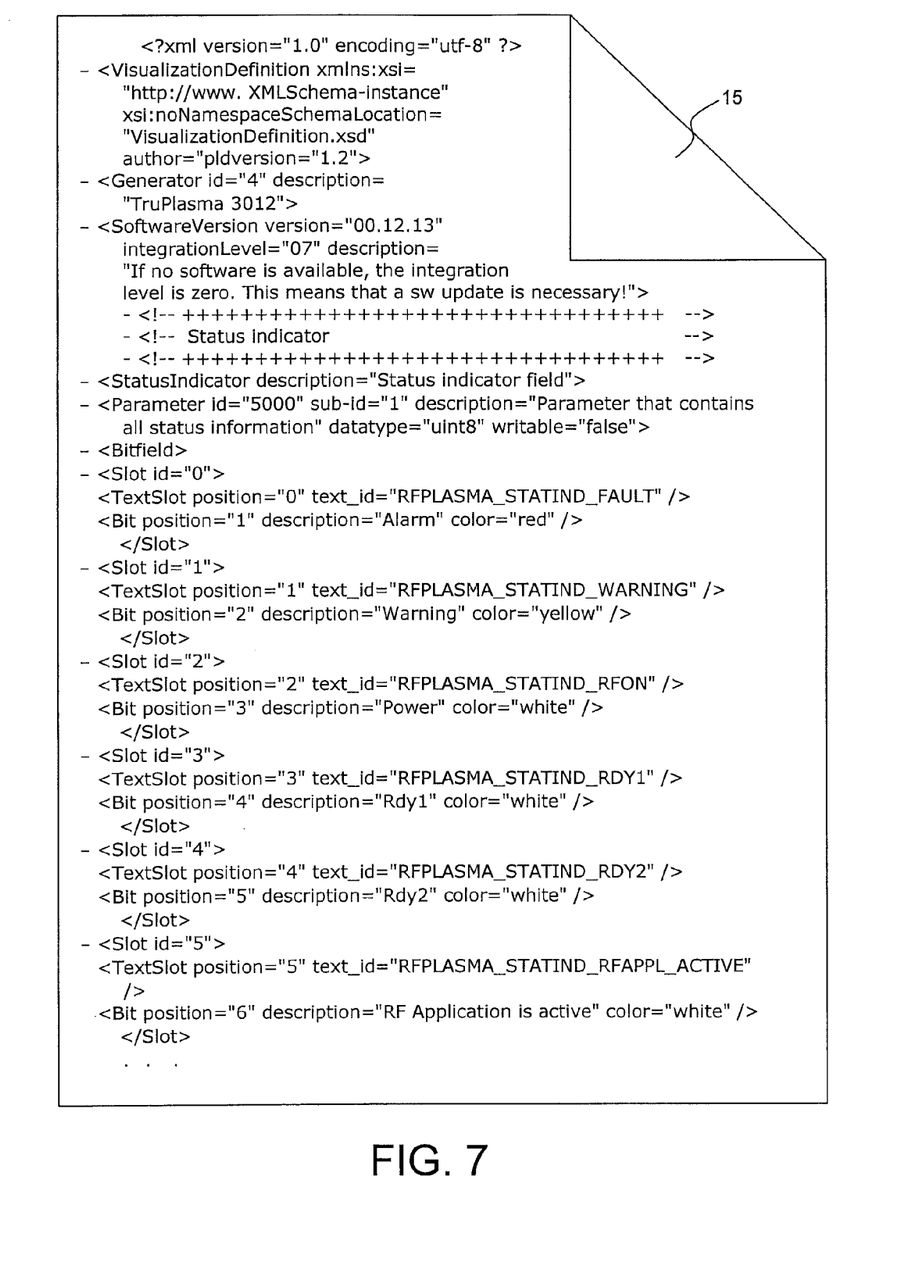
FIG. 7 is an illustration of an exemplary visualization data file.

FIG. 7 shows an illustration of an example visualization file 15 that is in an XML file format. A parameter file 14 and an identifier file 13 can be in the same format or in other formats which allows for easier configurable data analysis.

Figure 8:
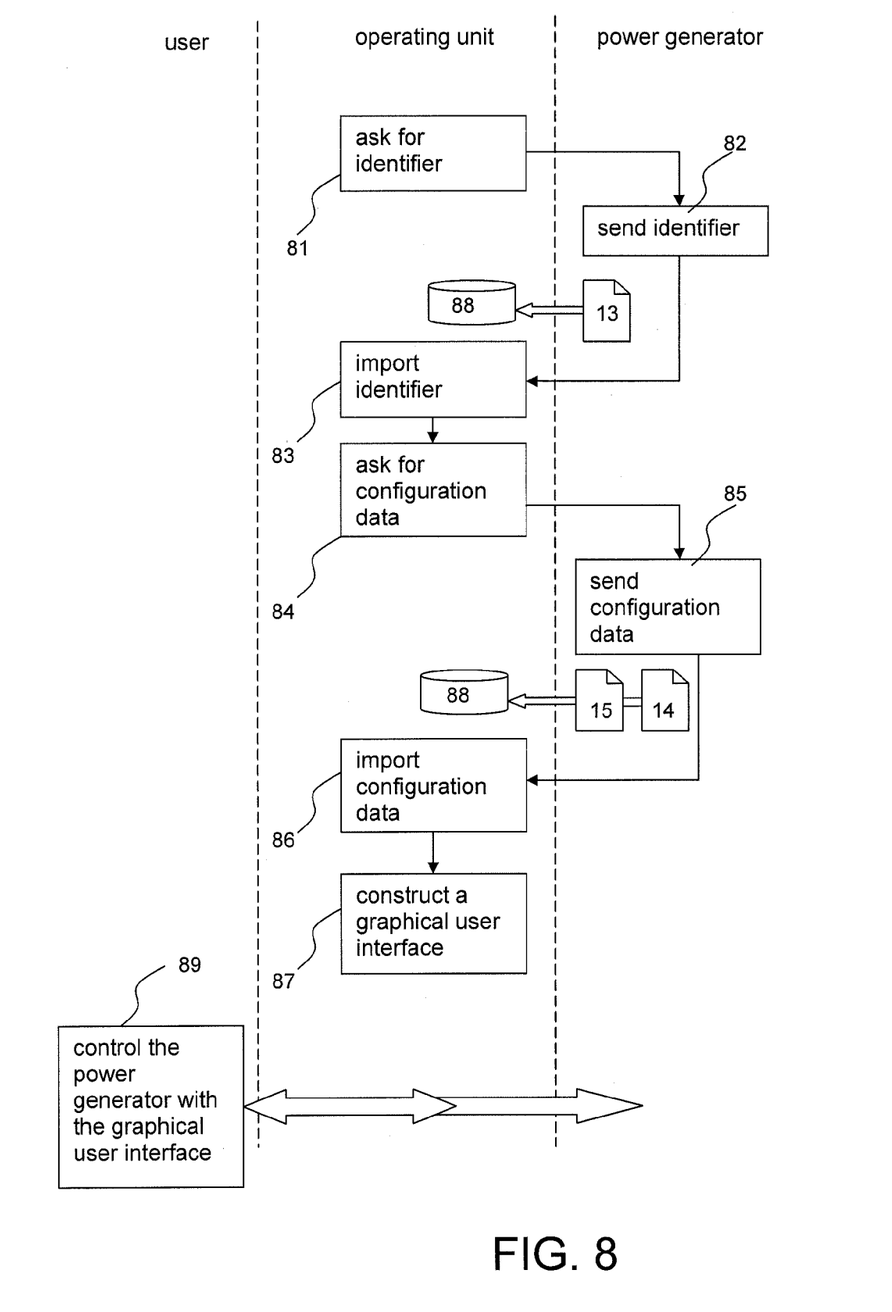
FIG. 8 is a flowchart of a method for operating power supply systems.

FIG. 8 shows a flow chart of a method 80a of operating a power supply system 100. The operating unit first asks the power generator for the identifier (step 81). In response, the power generator sends the identifier 13 to the operating unit (step 82). The operating unit then imports the identifier 13 and stores it in a memory 88 (step 83). The operating unit then asks the power generator for the configuration data (step 84). The configuration data can be the generator-specific configuration data based on the identifier. The configuration data can include two data files, a file of parameter data 14 and a file of visualization data 15. The power generator then sends the configuration data to the operating unit (step 85). The operating unit imports the configuration data and stores it in a memory 88 (step 86). The operating unit then constructs the graphical user interface (step 87). The user can now control the power generator with the use of the graphical user interface (step 87).

Figure 9:
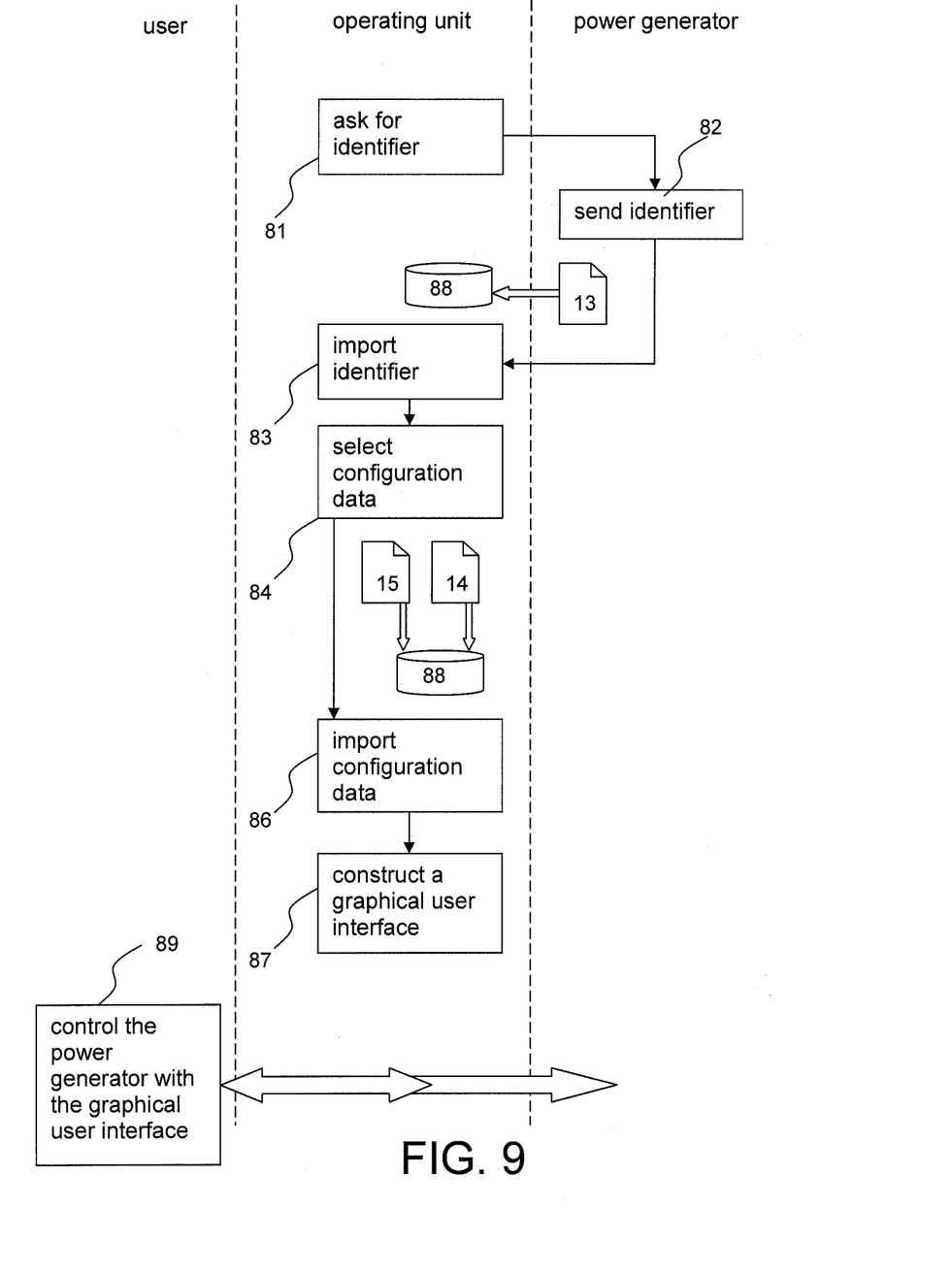
FIG. 9 is a flowchart of another example of a method for operating power supply systems.

FIG. 9 shows a flow chart of an alternative method 80b of operating a power supply system 100. The method shown in FIG. 9 is similar to the method shown in FIG. 8, however, as shown the operating unit selects the configuration data from its own data base instead of obtaining the configuration data from the power generator. This is achieved by using generator-specific configuration data based on the identifier.

A number of embodiments of the invention have been described. Nevertheless, it will be understood that various modifications may be made without departing from the spirit and scope of the invention. Accordingly, other embodiments are within the scope of the following claims.

What is claimed is:

1. A power supply system for a plasma application and/or an induction heating system, the power supply system comprising:
    at least two controllable power generators of different types, each controllable power generator comprising an associated identifier; and
    at least one operating unit for controlling at least one of the power generators, the operating unit comprising:
    a display device on which a graphic user interface can be displayed;
    an input device for manipulating the graphic user interface; and
    an operating application to import the respective identifiers from the power generators that are connected to the operating application, wherein the operating application constructs the graphic user interface on the display device based on generator-specific configuration data that are stored for each power generator and the identifiers, wherein the graphic user interface of the power generators of different types comprises a static region designed to illustrate superordinate information and superordinate control elements, wherein the superordinate control elements include one or more of an on/off switch and language selection, and the superordinate information includes one or more of type designation, identifier of the power generator, warnings, error statuses, and cooling water temperature, and wherein the generator-specific configuration data includes generator-specific visualization data that adapts how elements to be visualized are displayed on the graphic user interface.

2. The power supply system according to claim 1, wherein the configuration data of at least one power generator are stored in the power generator or the operating unit.

3. The power supply system according to claim 1, wherein the configuration data comprise generator-specific parameter data and/or visualization data.

4. The power supply system according to claim 1, wherein language data that can be processed by the operating application are stored in the operating unit.

5. The power supply system according to claim 1, wherein templates generated in the operating application are stored in the operating unit.

6. The power supply system according to claim 1, further comprising a plurality of operating units which substantially have the same graphic user interface.

7. The power supply system according to claim 1, wherein the static region comprises superordinate information and/or control elements.

8. The power supply system according to claim 1, wherein the graphic user interface for the power generators of different types comprises a dynamic region.

9. The power supply system according to claim 1, wherein the graphic user interface for the power generators of different types comprises the static region and a dynamic region, and the respective proportions of the surface-area on the graphic user interface that are associated with the dynamic region and the static region are substantially the same regardless of the number and type of connected power generators and system components.

10. The power supply system according to claim 1, wherein the graphic user interface for the power generators of different types comprises the static region and a dynamic region, the static region comprising control elements for changing between different views or different information contents in the dynamic region.

11. The power supply system according to claim 1, wherein the graphic user interface comprises a maximum of two regions.

12. The power supply system according to claim 11, wherein the two regions comprise the static region and a dynamic region, and the static region and the dynamic region are always visible for a user while the power supply system is on.

13. The power supply system according to claim 1, further comprising system components that can be controlled by the operating unit and each comprise an identifier.

14. The power supply system according to claim 1, wherein the generator-specific configuration data specifies a range of a maximum power displayed on the graphic user interface.

15. The power supply system according to claim 1, wherein the generator-specific configuration data includes generator-specific parameter data describing all known parameters for the corresponding generator or a sub-quantity thereof.

16. The power supply system according to claim 1, wherein the generator-specific configuration data specifies a range of at least one graph displayed on the graphic user interface.

17. A method for controlling at least one power generator using an operating unit, the method comprising:
importing an identifier of at least one power generator;
selecting and/or importing generator-specific configuration data based on the identifier imported; and
constructing a graphic user interface on a display device of the operating unit based on the configuration data using an operating application that is installed on the operating unit, wherein the graphic user interface comprises a static region designed to illustrate superordinate information and superordinate control elements, wherein the superordinate control elements include one or more of an on/off switch and language selection, and the superordinate information includes one or more of type designation, identifier of the power generator, warnings, error statuses, and cooling water temperature, and wherein the configuration data includes generator-specific visualization data that adapts how elements to be visualized are displayed on the graphic user interface.

18. The method according to claim 17, wherein substantially the same graphic user interfaces are produced for configuration data of different types of power generators.

19. The method according to claim 17, wherein the configuration data comprise generator-specific parameter data and/or visualization data.

20. The method according to claim 17, wherein language data are read and, based on the language data, information is displayed on the display device.

21. The method according to claim 17, wherein the graphic user interface is constructed in a dynamic manner.

22. The method according to claim 17, wherein static and dynamic contents are displayed on the display device.

23. The method according to claim 17, wherein templates that enable the graphic user interface to be adapted are defined in the operating application.

24. The method according to claim 23, wherein visualization data are associated with the templates.

25. The method according to claim 17, wherein for identical configuration data substantially identical graphic user interfaces are produced and displayed in different operating units.

26. The method according to claim 17, wherein the identifier and the configuration data of a controllable system component are imported and taken into consideration when constructing the graphic user interface.

27. The method according to claim 17, wherein the configuration data of a power generator are stored in the power generator or the operating unit, have a time stamp or a priority identification number, and the operating application decides based on the time stamp or the priority identification number whether the configuration data stored in the power generator or the operating unit are used to construct the graphic user interface on the display device.

28. The method according to claim 17, wherein with each power generator, there is an associated integration level that is determined by the operating application, the integration level being taken into account when constructing the graphic user interface.

29. A plasma and/or induction heating system comprising:
a first group of different power generators, an identifier being associated with each power generator type; and
a second group of different operating units,
each operating unit of the second group being able to be coupled to each power generator of the first group in order to control the respective power generator and being able to import the identifier of the coupled power generator, and
each operating unit having an operating application by which there can be produced, regardless of the power generator coupled to the operating unit, a graphic user interface which has substantially the same appearance for all power generators but which is adapted to the coupled power generators, wherein the graphic user interface comprises a static region designed to illustrate superordinate information and superordinate control elements, wherein the superordinate control elements include one or more of an on/off switch and language selection, and the superordinate information includes one or more of type designation, identifier of the power generator, warnings, error statuses, and cooling water temperature, and wherein the adaptation includes use of generator-specific visualization data that adapts how elements to be visualized are displayed on the graphic user interface.

\* \* \* \* \*